(12) United States Patent
Morkner et al.

(10) Patent No.: US 6,211,729 B1
(45) Date of Patent: Apr. 3, 2001

(54) AMPLIFIER CIRCUIT WITH A SWITCH BYPASS

(75) Inventors: Henrik Morkner, Palo Alto; Michael Louis Frank, Los Gatos, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/390,807

(22) Filed: Sep. 7, 1999

(51) Int. Cl.$^7$ .................... H03F 1/14; H03F 1/02; H03F 1/36; H03F 1/00
(52) U.S. Cl. .................. 330/51; 330/9; 330/110; 330/151
(58) Field of Search .................. 330/9, 51, 110, 330/151, 277

(56) References Cited

U.S. PATENT DOCUMENTS

| | | | |
|---|---|---|---|
| 5,459,428 | * 10/1995 | Kim et al. | 330/277 |
| 5,796,300 | * 8/1998 | Morgan | 330/9 |
| 5,880,630 | * 8/1998 | Iwamoto et al. | 330/9 |

OTHER PUBLICATIONS

Ray Moroney, Kevin Harrington, Wayne Struble, Brian Khabbaz, Mike Murphy, A High Performance Switched–LNA IC for CDMA Handset Receiver Applications, *1998 IEEE Radio Frequency Integrated Circuits Symposium*, p.43–46.

* cited by examiner

*Primary Examiner*—Robert Pascal
*Assistant Examiner*—Patricia T. Nguyen

(57) ABSTRACT

An amplifier/switch circuit includes a first circuit input, a second circuit input, a circuit output, an amplifier, a switching circuit and a DC blocking capacitor. The amplifier has an amplifier control input, a first amplifier output and a second amplifier output. The amplifier control input is connected to the first circuit input. The first amplifier output is connected to the second circuit input. The second amplifier output is connected to the circuit output. A switching circuit has a switch control input, a switch input and a switch output. The switch control input is connected to the circuit output. The control input is connected to the second circuit input. The DC blocking capacitor is connected between the amplifier control input of the first transistor and the switch input.

12 Claims, 1 Drawing Sheet

AMPLIFIER CIRCUIT WITH A SWITCH BYPASS

BACKGROUND

The present invention concerns circuits used for communication systems and pertains specifically to a circuit that includes an amplifier and a bypass switch useful for low power devices that utilize microwave signals.

Modem digital wireless systems, such as those used in cellular phones and local area networks (LANs) utilize signals with a frequency typically in the range of 0.5 gigahertz (GHz) to 6.0 GHz.

For strong transmission signals, for example when there is a relatively short transmission distance, it is often advantageous to use a switch or series of switches to bypass a microwave amplifier in order to conserve power. The microwave amplifier, while important to achieve high dynamic range for weak transmission signals, may be unnecessary for strong transmission signals. Providing a bypass of the microwave amplifier allows the system gain to be lowered down when the input signal is strong.

In the prior art, to provide for the bypass of a microwave amplifier, switch components are mounted on a printed circuit board. The switch components route the signal to the amplifier to perform the basic amplification function or to the output. Each switch component is, for example, a mechanical type switch, a solid state field-effect transistor (FET) switch or multiple diodes functioning as a switch. A typical topology of an amplifier with a bypass switch includes three switches. A bypass switch is use to bypass the amplifier. A switch connected to the input of the amplifier and a switch connected to the output of the amplifier are used to isolate the amplifier when the bypass switch is turned on and the amplifier is being bypassed.

One disadvantage of the above-described prior art topology is that every switch and the amplifier requires a separate bias/control circuit. In addition several components must be used to build each switch and amplifier, complicating the system design and using up valuable space. Mechanical switches require high voltage levels (15V or more) and are slow in switching speed. Diode switches require that current be wasted to turn them on and off and require numerous DC bias elements. While switches could be integrated with the amplifier into a single integrated circuit (IC), the control and signal degradation due to parasitic capacitances within such an IC could degrade the performance of the IC.

Ray Moroney, Kevin Harrington, Wayne Struble, Brian Khabbaz, Mike Murphy, *A High Performance Switched-LNA IC for CDMA Handset Receiver Applications,* 1998 IEEE Radio Frequency Integrated Circuits Symposium, p. 43–46, shows an integrated Gallium Arsenide (GaAs) FET solution where a switch function is integrated with an amplifier. However, the disclosed circuit uses an external control for the switch function. Additionally, the disclosed amplifier/switch uses only a series mode switch. Also, the disclosed circuit uses several blocking capacitors that increase die size and cost.

SUMMARY OF THE INVENTION

In accordance with the preferred embodiment of the present invention, an amplifier/switch circuit includes a first circuit input, a second circuit input, a circuit output, an amplifier, a switching circuit and a DC blocking capacitor. The amplifier has an amplifier control input, a first amplifier output and a second amplifier output. The amplifier control input is connected to the first circuit input. The first amplifier output is connected to the second circuit input. The second amplifier output is connected to the circuit output. A switching circuit has a switch control input, a switch input and a switch output. The switch control input is connected to the circuit output. The control input is connected to the second circuit input. The DC blocking capacitor is connected between the amplifier control input of the first transistor and the switch input.

In the preferred embodiment, a resistance is connected between the second circuit input and the circuit output. A feedback resistance is connected between the second amplifier output of the first transistor and the input of the switching circuit. For example, the switching circuit comprises three transistors connected in a series-shunt-series configuration.

Using the present invention, only three terminals are required to implement an amplifier/switch circuit. The first circuit input operates to receive a high frequency signal and provides a DC reference. The second circuit input serves as a high frequency ground, and as a DC control voltage to place the amplifier/switch circuit in a through mode. The amplifier/switch circuit places the amplified signal on the circuit output. The DC power supply is also placed on the circuit output.

When the amplifier/switch circuit is in gain mode, the amplifier/switch circuit amplifies the signal from the circuit input to the circuit output. When the amplifier/switch circuit is in through mode, the amplifier/switch circuit goes automatically to zero current and routes the signal on the circuit input to the circuit output with minimal loss.

The disclosed embodiment of the present invention offers several advantages over the use of several discrete components to duplicate this function. The primary advantages are small size, low cost, ease of use, ease of implementation and zero current draw during through mode operation.

The disclosed embodiment of the present invention also is advantageous over the integrated GaAs FET solution discussed above in the Background section. For example, a series-shunt-series combination of field effect transistors (FET) overcome several potential radio frequency (RF) problems in the integrated GaAs FET solution discussed above. The series-shunt-series combination of transistors also provides improved isolation resulting in greater circuit stability over a wide frequency range. The higher isolation (on the order of 25 dB at microwave frequencies) allows for greater gain. This isolation contributes to increasing performance of the amplifier/switch circuit allowing the amplifier section to operate to higher frequencies, for example up to proximately 8 GHz. In addition, the feedback resistor in the preferred embodiment helps RF performance and also provides a DC pull-up resistor of the transistors connected in series. The disclosed embodiment of the amplifier/switch circuit can be used in a simple three lead package, which offers many RF and microwave performance advantages.

DESCRIPTION OF THE PREFERRED EMBODIMENT

Figure 1:
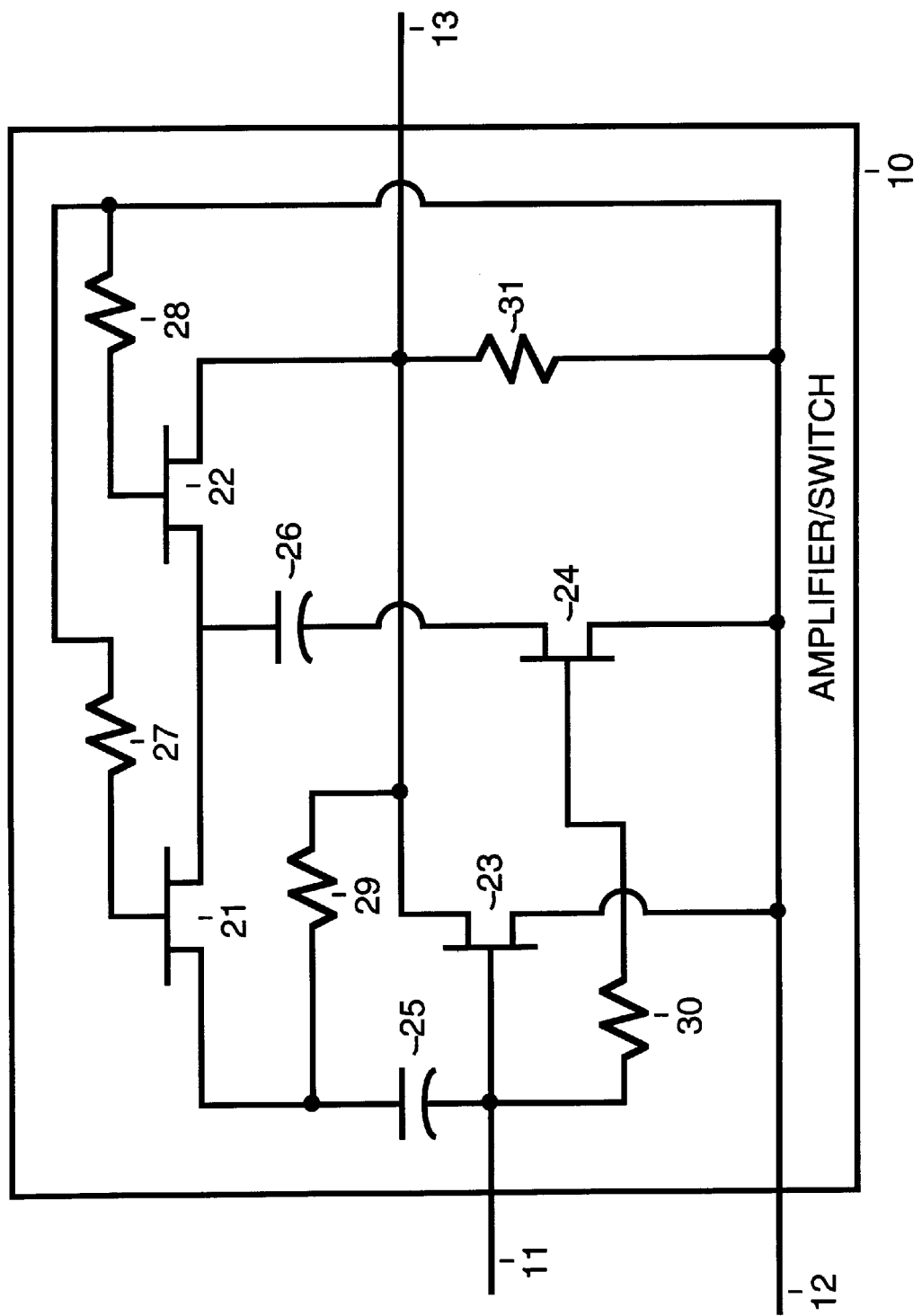
FIG. 1 is a schematic of a circuit of an amplifier circuit with a bypass switch in accordance with a preferred embodiment of the present invention.

FIG. 1 is a schematic of an amplifier/switch circuit 10 that is an amplifier that includes a switch bypass. On a circuit input 11 is placed a 1.9 GHz radio frequency signal. A DC component (Vr) on Circuit input 11 is DC biased at, for example, 0 volts. A ground input 12 functions as a ground voltage for AC signals and has a DC component (Vc) that serves as a DC control voltage. When the DC component (Vc) of ground input 12 is in the on state (e.g., at 0 volts), amplifier/switch circuit 10 is in a gain mode. When the DC component (Vc) of ground input 12 is in the off state (e.g., at 3 volts), amplifier/switch circuit 10 is in an amplifier through mode. A DC component (Vd) of a circuit output 13 is biased, for example, at 3 volts. When the amplifier is in gain mode, amplifier/switch circuit 10 places an amplified radio frequency (RF) signal on circuit output 13.

Amplifier/switch circuit 10 includes a field-effect transistor (FET) 21, an FET 22, an FET 23, an FET 24, a feedback capacitor 25, a DC block capacitor 26, a resistor 27, a resistor 28, a feedback resistor 29, a resistor 30 and a resistor 31, connected as shown in FIG. 1.

Amplifier/switch circuit 10 provides good performance in gain mode, and the amplification is switched easily and efficiently out when not needed. When amplifier/switch circuit 10 is powered up (e.g., when the DC component (Vc) of ground input 12 is at 0 volts), amplifier/switch circuit 10 amplifies the AC signal from circuit input 11 to circuit output 13. When amplifier/switch circuit 10 is powered down (e.g., Vc is at 3 volts) amplifier/switch circuit 10 goes automatically to zero current and routes signals from circuit input 11 to circuit output 13 with minimal loss.

In gain mode amplifier/switch circuit 10 exhibits gain and draws DC current to obtain that gain. In amplifier through mode, amplifier/switch circuit 10 has the gain section shut down and the signal is routed from circuit input 11 to output 12 with some loss FET 23 is used during the gain mode to provide all the gain in the amplifier. FET 21, FET 22, and FET 24 are used at zero bias (e.g., when Vc is at 3 volts) as voltage controlled resistors (basically switches).

During the gain mode, Vc is at 0 volts and the DC component (Vd) on circuit output 13 is biased at 3 volts. This voltage difference is high enough to put FET 23 in the saturated FET region. Depending upon the semiconductor technology, voltage differential Vc and Vd necessary to place FET 23 in the saturated FET region can vary significantly but is usually 1.0 volts or higher.

Also in the gain mode, the DC component (Vr) on circuit input 11 is at or near zero volts. Vc can be adjusted from Vr−Vc=0.0 volts to Vr−Vc=Pinch-off Voltage. The Pinch-off Voltage is the gate to source voltage of FET 23 required to deplete the semiconductive region of FET 23 so that less than 10% of the Idss current through will flow from drain to source of FET 23 from a given drain-to-source voltage. This value when FET 23 is a GaAs FET is usually on the order of 0.5 volts.

In the gain mode, the source lead of FET 23 is tied to circuit input (RF ground) 12. In the gain mode, FET 23 provides gain from circuit input 11 (connected to the gate of FET 23) to circuit output 13 (connected to the drain of FET 23) in a traditional common source mode FET amplifier. Feedback resistor 29 and feedback capacitor 25 are used to temper the gain and provide input/output matching to acceptable system levels for usage.

In the gain mode, FET 21 and FET 22 are off (highly resistive). FET 22 and FET 21 are off because the drain of FET 21 is connected to circuit output 13 through feedback resistance 29 and the drain of FET 22 is connected directly to circuit output 13. The source leads of FET 22 and FET 21 are DC floating, but are naturally drawn to the same voltage potential of their respective drains since no current can flow through FET 22 or FET 21 and thus Vds for both FET 21 and FET 22 is at 0.0 volts.

The gate of FET 21 is tied through resistor 27 to RF ground input 12. The gate lead of FET 22 is tied through separate resistor 28 respectively to input 12. Resistor 27 and resistor 28 are made in value large enough to prevent RF signal leakage to input (RF ground) 12. This requires resistor 27 and resistor 28 to have resistance values usually on the order of a few thousand ohms. Since Vc is significantly greater than the FET 21 and FET 22 pinch-off voltage, FET 21 and FET 22 are off.

In gain mode, FET 24 is on (low resistance). This is due to the drain of FET 24 being tied to RF ground input 12, the source of FET 24 floating, and the gate of FET 24 being tied through resistor 30 to circuit input 11. Since Vr −Vc is less than the FET 24 pinch-off voltage, FET 24 remains on. The combination of a series (FET 21), shunt (FET 24), series (FET 22) switch provides excellent radio frequency (RF) and microwave isolation, allowing FET 23 to act as a high performance amplifier. Without such a series-shunt-series combination, RF leakage may come through the switch, causing instability, and degraded performance over voltage, frequency, noise figure, and power. By externally adjusting Vc, the current Id can be adjusted through FET 23 and not affect the switching circuitry. This allows the gain mode to be adjusted over a wide range of power and linearity requirements.

In the through mode, the Vc is allowed to DC float (that is set to a high resistance level on the order of many thousands of ohms). In this mode, resistor 31 automatically pulls the Vc voltage to equal Vd on circuit output 13. The drain and source of FET 23 in this mode are both equal to Vd on circuit output 13. Since Vr−Vc of FET 23 is now greater than pinch-off voltage, FET 23 goes off (high resistance). In the same manner, the drain and source voltage of FET 24 are equal to Vd and the gate of FET 24 is resistively tied to Vr, thus turning FET 24 off. The drains of FET 21 and FET 22 are still at Vd in through mode. However, since the gates of both FET 21 and FET 22 are tied with resistors to Vc and Vc now equals Vd in voltage, FET 21 and FET 22 are now turned on (low resistance) since the gate voltage for each of FET 21 and FET 22 is equal to Vd which is equal to Vc. This completes a low resistance path from circuit input 11 to output 12 through the now on FET 21 and FET 22. No current is used by the circuit since there is no DC current paths from circuit input 11 to ground input 12. The switch transistors of amplifier/switch circuit 10 turn on and off by field effects only and require little or no current to operate (the current draw is on the order of few microamps).

In the described circuit, FET 21, FET 24 and FET 22 are connected in a series-shunt-series combination that overcomes several RF problems. The series-shunt-series configuration results in better isolation and more stability over a wide frequency range, Typically, the amount of gain in FET 23 is limited by the switch isolation. If the gain were to exceed the isolation, amplifier/switch circuit 10 would have a great propensity to oscillate. The series-shunt-series configuration offers higher isolation (on the order of 25 dB at microwave frequencies) so the amplifier can have more gain than other topologies. More gain is advantageous in many systems.

Amplifier/switch circuit 10 offers isolation and performance to very high microwave frequencies (up to and around 12 GHz). This allows FET 23 to operate at higher frequencies. The incorporated feedback resistor (feedback resistor 29) not only helps RF performance, but provides a DC pull-up resistor for switching circuitry.

The gate controls of the series FETs, the drain of FET 24 are all tied to Vc. This simplifies the usage and control of amplifier/switch circuit 10 by eliminating separate external ports for both the amplifier and the switch.

Since, circuit input 11 of amplifier/switch circuit 10 is allowed to DC float, this allows amplifier/switch circuit 10 in usage to have a voltage reference other than 0.0 V. This is very important when this circuit is used with bipolar or CMOS DC control circuitry that cannot provide a true 0 volt Vc signal for maximum bias. Amplifier/switch circuit 10 can also be used in a simple three lead package, which offers many RF and microwave performance advantages.

The components of amplifier/switch circuit 10 shown in FIG. 1 can be implemented in any FET technology. For example, in the preferred embodiment of the present invention, amplifier/switch circuit 10 is implemented in PHMET GaAs. Alternatively, another FET technology, such as MESFET, CIVICS, JFET, etc., can be used.

In the preferred embodiment of the present invention, FET 21 is, for example, a 300 micron depletion mode FET. FET 22 is, for example, a 300 micron depletion mode FET. FET 23 is, for example, a 385 micron gain FET. FET 24 is, for example, a 150 micron depletion mode FET. Capacitor 25 is, for example, a 2.3 picofarad (pF) DC blocking capacitor. Capacitor 26 is, for example, a 1.5 picofarad (pF) DC blocking capacitor. Resistor 27 is, for example a 1 kilohm resistance. Resistor 28 is, for example a 1 kilohm resistance. Resistor 29 is, for example a 1.35 kilohm feedback resistance. Resistor 30 is, for example a 1 kilohm resistance. Resistor 31 is, for example a 10 kilohm DC resistance.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. An amplifier/switch circuit comprising:

a first circuit input;

a second circuit input;

a circuit output;

a first transistor having a gate, a source and a drain, the gate being connected to the first circuit input, the source being connected to the second circuit input and the drain being connected to the circuit output;

a second transistor having a gate, a source and a drain;

a third transistor having a gate, a source and a drain, the source of the second transistor being connected to the source of the third transistor and the drain of the third transistor being connected to the circuit output;

a first capacitance being connected between the gate of the first transistor and the drain of the second transistor;

a first resistance being connected between the gate of the second transistor and the second circuit input; and a second resistance being connected between the gate of the third transistor and the second circuit input;

wherein voltage on the second circuit input is varied to turn the second transistor and the third transistor on and off.

2. An amplifier/switch circuit as in claim 1, additionally comprising:

a third resistance connected between the drain of the first transistor and a drain of the second transistor.

3. An amplifier/switch circuit as in claim 1, additionally comprising:

a fourth transistor having a gate, a source and a drain, a drain of the fourth transistor being connected to the second circuit input;

a third resistance connected between the gate of the first transistor and the gate of the fourth transistor; and, a second capacitance connected between the source of the fourth transistor and the source of the second transistor.

4. An amplifier/switch circuit as in claim 1, additionally comprising:

a third resistance connected between the second circuit input and the circuit output.

5. An amplifier/switch circuit as in claim 1, additionally comprising:

a third resistance connected between the second circuit input and the circuit output;

a fourth resistance connected between the drain of the first transistor and a drain of the second transistor;

a fourth transistor having a gate, a source and a drain, a drain of the fourth transistor being connected to the second circuit input;

a fifth resistance connected between the gate of the first transistor and the gate of the fourth transistor; and, a second capacitance connected between the source of the fourth transistor and the source of the second transistor.

6. An amplifier/switch circuit as in claim 5, wherein the first transistor, the second transistor, the third transistor and the fourth transistor are all field-effect transistors.

7. An amplifier/switch circuit as in claim 1, wherein the first transistor, the second transistor and the third transistor are all field-effect transistors.

8. An amplifier/switch circuit comprising:

a first circuit input;

a second circuit input;

a circuit output;

an amplifier having an amplifier control input, a first amplifier output and a second amplifier output, the amplifier control input being connected to the first circuit input, the first amplifier output being connected to the second circuit input and the second amplifier output being connected to the circuit output;

a switching circuit having a control input, a switch input and a switch output, the switch output being connected to the circuit output and the switch control input being connected to the second circuit input and to the first amplifier output, wherein voltage on the second circuit input is varied to turn the switching circuit on and off; and, a first capacitance being connected between the amplifier control input of the amplifier and the switch input.

9. An amplifier/switch circuit as in claim 8, additionally comprising:

a feedback resistance connected between the second amplifier output of the amplifier and the input of the switching circuit.

10. An amplifier/switch circuit as in claim 8, additionally comprising:

a resistance connected between the second circuit input and the circuit output.

11. (Twice Amended) An amplifier/switch circuit as in claim 8, wherein the amplifier is a field-effect transistor.

12. An amplifier/switch circuit as in claim 8, wherein the switching circuit comprises three transistors connected in a series-shunt-series configuration.

* * * * *